US008860095B2

(12) United States Patent
Gates et al.

(10) Patent No.: US 8,860,095 B2
(45) Date of Patent: Oct. 14, 2014

(54) INTERCONNECT WIRING SWITCHES AND INTEGRATED CIRCUITS INCLUDING THE SAME

(71) Applicant: International Business Machines Corporation, Armonk, NY (US)

(72) Inventors: Stephen M. Gates, Ossining, NY (US); Daniel C. Edelstein, White Plains, NY (US); Kailash Gopalakrishnan, San Jose, CA (US); Ramachandran Muralidhar, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/766,028

(22) Filed: Feb. 13, 2013

(65) Prior Publication Data

US 2014/0225165 A1    Aug. 14, 2014

(51) Int. Cl.
*H01L 27/112* (2006.01)
*H01L 23/52* (2006.01)

(52) U.S. Cl.
CPC .............................. *H01L 27/11206* (2013.01)
USPC .................... 257/209; 257/208; 257/E23.141

(58) Field of Classification Search
CPC .................................................... H01L 21/768
USPC ................................................. 257/208, 209
See application file for complete search history.

(56) References Cited

U.S. PATENT DOCUMENTS

| 7,402,847 | B2 | 7/2008 | Kozicki et al. |
| 7,929,331 | B2 | 4/2011 | Kozicki |
| 2012/0012897 | A1 * | 1/2012 | Besser et al. .................. 257/208 |
| 2012/0063194 | A1 | 3/2012 | Baek et al. |
| 2012/0193600 | A1 * | 8/2012 | Himeno et al. ................... 257/4 |
| 2013/0064002 | A1 * | 3/2013 | Terai ............................. 365/148 |

OTHER PUBLICATIONS

Jason Cong, et al. "mrFPGA: A Novel FPGA Architecture with Memristor-Based Reconfiguration", Department of Computer Science, University of California, pp. 1-8.
Masakazu Aono, et al., "The Atomic Switch", Proceedings of the IEEE, vol. 98, No. 12, Dec. 2010, pp. 2228-2236.
R.F. Rizzolo, et al. "IBM System Z9 eFuse Applications and Methodology", IBM J. Research and Development, vol. 51, No. 1/2, Jan./Mar. 2007, pp. 65-75.
Norm Robson, et al. "Electrically Programmable Fuse (eFUSE): From Memory Redundancy to Autonomic Chips", IEEE 2007 Custom Integrated Circuits Conference (CICC), IBM J. Research and Development, Hopewell Junction, NY May 14, 2009, pp. 799-804.

* cited by examiner

*Primary Examiner* — Mamadou Diallo
(74) *Attorney, Agent, or Firm* — McGinn IP Law Group, PLLC (57) ABSTRACT

An electronic circuit, includes a plurality of electronic devices configured as interconnected to provide one or more circuit functions and at least one interconnect structure that includes a first patterned conductor connected to a terminal of a first electronic device in the electronic circuit. A second patterned conductor is connected to a terminal of a second electronic device in the electronic circuit. A first electrode is connected to a portion of the first patterned conductor, and a second electrode is connected to a portion of the second patterned conductor. A metal oxide region is formed between the first electrode and the second electrode. The metal oxide region provides a reprogrammable switch function between the first patterned conductor and the second patterned conductor by providing a conductivity that is selectively controlled by a direction and an amount of current that passes through the metal oxide region during a switch setting operation for the metal oxide region.

22 Claims, 9 Drawing Sheets

INTERCONNECT WIRING SWITCHES AND INTEGRATED CIRCUITS INCLUDING THE SAME

BACKGROUND OF THE INVENTION

1. Field of the Invention

The present invention generally relates to circuits implemented with interconnect wiring switches and, more particularly, a switching function is implemented using a metal-oxide switch that is reprogrammable.

2. Description of the Related Art

Figure 1:
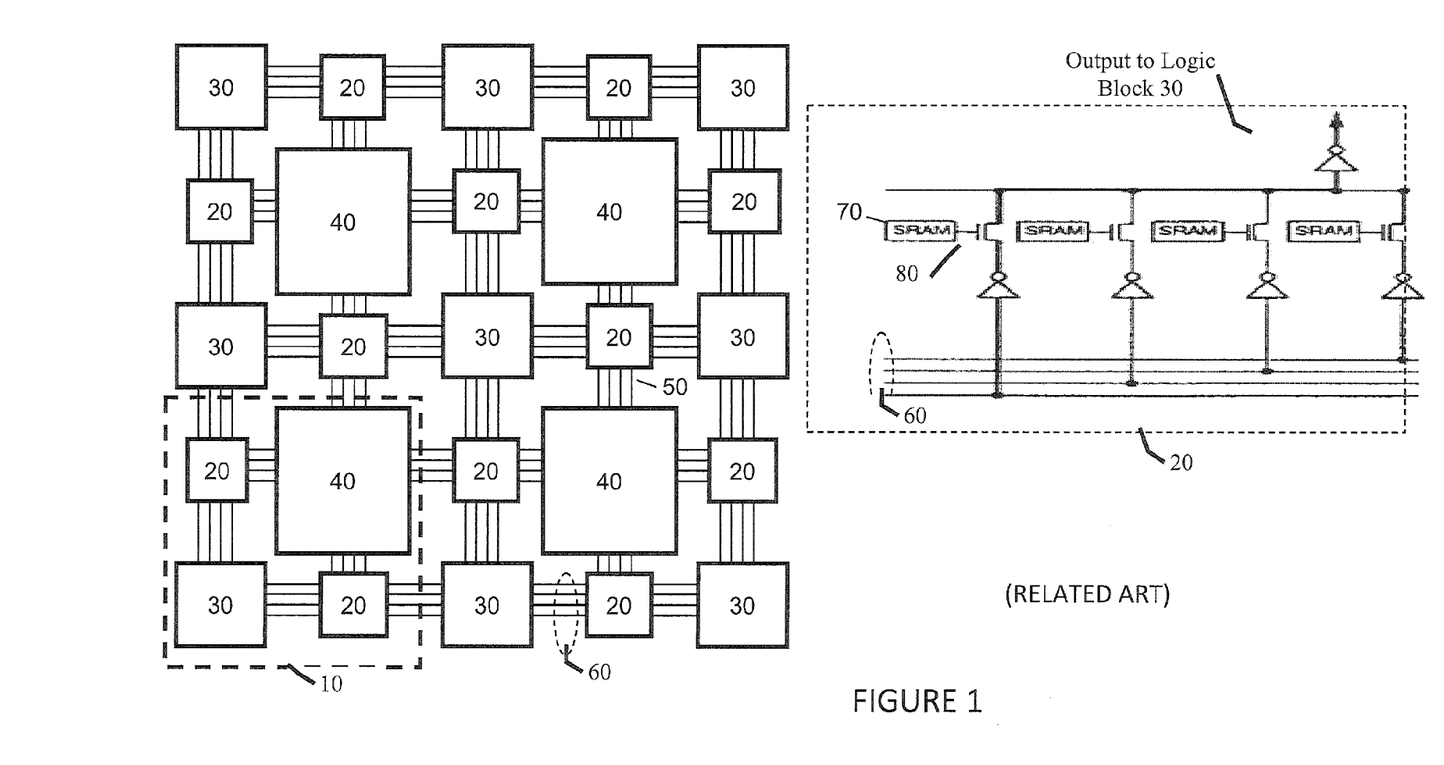
FIG. 1 shows a conventional FPGA architecture 100.

A Field Programmable Gate Array (FPGA) is a type of integrated circuit that can be reconfigured using electrically programmable switches in order to realize a large range of arbitrary functions. FIG. 1 exemplarily shows a conventional FPGA architecture 100 that includes an array of tiles, and each tile 10 includes two connection blocks (CB) 20, one logic block (LB) 30 and one switch block (SB) 40. Each LB 30 generally includes a cluster of basic logic elements (BLEs), typically lookup tables (LUTs) and circuits required to use these, to provide customizable logic functions.

Wire segments 50, which are wires that are unbroken by a programmable switch, are connected with each other through SBs 40. A sequence of one or more wire segments 50 in a line is referred to herein as a track and a group of parallel tracks is referred to herein as a routing channel 60. The LBs 30 are connected to routing channels 60 through CBs 20.

The CB 20 performs input/output between the LB 30 and wire segments 50 and the SB 40 switches connections of the wire segments 50. The switching of the wire segments 50 in the SB 40 or the input/output in the CB 20 is controlled by using electrically programmable switches. It is noted that, in the configuration exemplarily denoted in FIG. 1, LBs 30 and CBs 20 are also used to interconnect each tile unit 10 to its adjacent tile units.

In arriving at the concepts described herein, the present inventors realized that there is a problem in the conventional FPGAs, in that these CBs 20 and SBs 40 account for a large majority of a conventional FPGA's total area, delay, and power consumption.

More specifically, as is shown in FIG. 1, a typical circuit design of the CBs 20 uses Static Random Access Memory (SRAM) cells 70 to control pass gate transistors 80. It should be noted that the SRAM cells can also be used to control the selector pin of a multiplexer (MUX) as well. The pass gate transistor 80 acts as either a closed switch or an open switch according to a value of a bit of the SRAM cell 70.

Each of the SRAM cells 70 is generally a six-transistor (6T) cell that includes two inverters each including an N-type transistor and a P-type transistor, and two N-type transistors connected to a row line. The output of each of the SRAM cells 70 is generally connected to a pass gate transistor 80 (or the selector pin of a MUX). The pass gate transistor 80 is relatively larger than the transistors of the SRAM cell 70.

In the conventional technology FPGA architecture, these circuit components are formed in the Si wafer substrate. Also in the conventional technology FPGA architecture, information stored in the SRAM cells is volatile, meaning it is lost when the circuit is powered down.

Additionally, the present inventors have recognized that other types of circuits that rely on a switching function also have problems. For example, another conventional technology provides a smaller sized programmable switch called an "antifuse". An antifuse is a device that has two terminals and presents an open circuit when unprogrammed. To program the antifuse, e.g., cause it to present a closed circuit, a current pulse is applied across the terminals causing the antifuse to blow and create a permanent connection between two wires.

However, antifuses are only able to be programmed once and, thereafter, are no longer re-programmable. As a result, they are not suitable for applications which may require multiple instances of reprogramming. This is also true for the eFuse device. Generally, antifuse and eFuse devices are used to select from redundant memory arrays at the time of chip testing to increase the chip yield.

Accordingly, the present inventors have recognized that there exists a need to improve such circuits as FPGAs and microprocessors that utilize redundant cache memory arrays or redundant circuit blocks.

Similarly, a need is recognized to exist for a way to engage in performance tuning of a chip such that the function of the chip (or a sub-system thereof) relative to a certain reprogrammable switch can be reprogrammed multiple times, as well as other circuit types that would benefit from a reduction of area devoted to the switching function, particularly if reprogrammability is also a desirable feature for the switching function.

In addition, there is a need to retain any reprogrammed information in a non-volatile device when the circuit is powered down, thus enabling rapid return to the same state when the chip is turned on.

SUMMARY OF THE INVENTION

In view of the foregoing and other exemplary problems, drawbacks, and disadvantages of the conventional methods and structures, an exemplary feature of the present invention is to provide a method and structure in which a switching function for a circuit is reduced.

It is another exemplary feature of the present invention to provide such method as additionally providing reprogrammability.

It is yet another exemplary feature of the present invention to provide a structure and method whereby the programmable interconnects of an FPGA are improved so as to reduce the area of the FPGA chip.

Another exemplary aspect of the present invention is retention of the programmed interconnect state when the circuit is powered down.

Another exemplary aspect of the present invention includes increasing the chip yield of relative to that of conventional technologies and somewhat similarly increasing the lifetime of a chip, by providing a metal oxide switch to select between various redundant cells of a chip as needed.

Another exemplary aspect of the present invention is to provide a method for circuit blocks to share signals through a central connecting hub rather than through hard wired interconnects.

To achieve the above-identified aspects and other aspects and features, in a first exemplary aspect described herein is an electronic circuit, including a plurality of electronic devices configured as interconnected to provide one or more circuit functions and at least one interconnect structure that includes a first patterned conductor connected to a terminal of a first electronic device in the electronic circuit; a second patterned conductor connected to a terminal of a second electronic device in the electronic circuit; a first electrode connected to a portion of the first patterned conductor; a second electrode connected to a portion of the second patterned conductor; and a metal oxide region formed between the first electrode and the second electrode, wherein the metal oxide region provides a reprogrammable switch function between the first patterned conductor and the second patterned conductor by providing a conductivity that is selectively controlled by a direction and an amount of current that passes through the metal oxide region during a switch setting operation for the metal oxide region.

In a second exemplary aspect, also described herein is a method of fabricating an electronic chip, including forming a plurality of electronic devices configured as interconnected to provide one or more circuit functions; and forming at least one interconnect structure that includes a first patterned conductor connected to a terminal of a first electronic device in the electronic circuit; a second patterned conductor connected to a terminal of a second electronic device in the electronic circuit; a first electrode connected to a portion of the first patterned conductor; a second electrode connected to a portion of the second patterned conductor; and a metal oxide region formed between the first electrode and the second electrode. The metal oxide region provides a reprogrammable switch function between the first patterned conductor and the second patterned conductor by providing a conductivity that is selectively controlled by a direction and an amount of current that passes through the metal oxide region during a switch setting operation for the metal oxide region.

In a third exemplary aspect, also described herein is a method of providing a switching function in an electronic circuit that includes a plurality of electronic devices configured as interconnected to provide one or more circuit functions. The method includes forming at least one interconnect structure having a first patterned conductor connected to a terminal of a first electronic device in the electronic circuit; a second patterned conductor connected to a terminal of a second electronic device in the electronic circuit; a first electrode connected to a portion of the first patterned conductor; a second electrode connected to a portion of the second patterned conductor; and a metal oxide region formed between the first electrode and the second electrode. The metal oxide region provides a reprogrammable switch function between the first patterned conductor and the second patterned conductor by providing a conductivity that is selectively controlled by a direction and an amount of current that passes through the metal oxide region during a switch setting operation for the metal oxide region.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Referring now to the drawings, and more particularly to FIGS. 2A-7, exemplary embodiments of the method and structures according to the present invention will now be discussed.

Figure 2A:
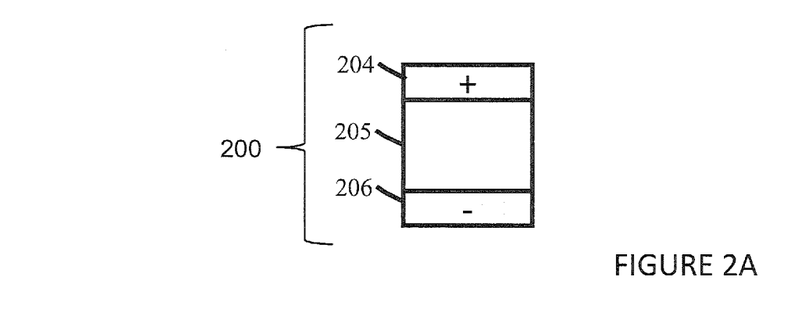
FIG. 2A shows an exemplary embodiment 200 of a metal oxide switch described and implemented herein.

FIG. 2A shows an exemplary embodiment of a metal oxide switch 200. The metal oxide switch 200 is a two-terminal switch-like device that can be considered to include a first electrode 204, a metal oxide 205, and a second electrode 206.

Exemplary metal oxides from which the metal oxide 205 of the reprogrammable antifuse 200 may be formed include Hafnium Oxide (HfOx), Tantalum Oxide (TaOx), Nickel Oxide (NiOx), Titanium Oxide (TiOx), Tungsten Oxide (WOx), Aluminum Oxide (AlOx), Strontium Titanium Oxide (SrTiOx), Zirconium oxide (ZrOx), and Zinc Oxide (ZnOx), or any combination of these metal oxides. The metal oxide 205 may be formed by using a chemical vapor deposition (CVD) method, a physical vapor deposition (PVD) method, or an atomic layer deposition (ALD) method as is well known in the art.

The first electrode 204 and the second electrode 206 play important roles and may each be formed, for example, as a film including one or more of hafnium (Hf), Vandium (V), iridium (Ir), platinum (Pt), tungsten (W), palladium (Pd), iridium oxide (IrOx), titanium nitride (TiN), tantalum nitride (TaN), titanium aluminum nitride (TiAlN), tungsten nitride (WN), ruthenium (Ru), and ruthenium oxide (RuOx). The nitride electrode such as TiN, TaN, WN, and the like may be non-stoichiometric, so that, for example, $Ti_xN_y$ describes the composition, where y>1 and x<1, for example, or y<1 and x>1.

In some exemplary embodiments, the metal oxide switch 200 is formed with interfacial layers in order to achieve very high resistance of a non-conductive (OFF) state 200B, of the order of 100 MΩ to 1 GΩ. A thin layer of $SiO_x$ or $SiN_{x\,or}$ SiCN may be added between either electrode 204 or 206 and the oxide layer 205 to increase the OFF state resistance.

In some exemplary embodiments, the metal oxide switch 200 contains more than one layer within the oxide layer 205, with a layer of conductor placed between the oxide layer, for example, two layers of metal oxide. In this case, the materials listed above to form the electrodes 204 and 206 may be used as the conductor between the oxide layers.

Figure 2B:
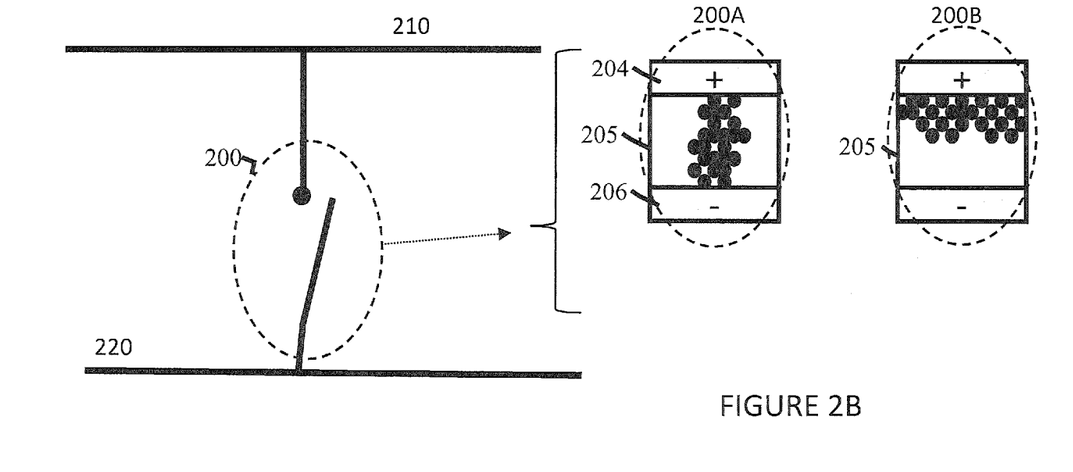
FIG. 2B shows exemplarily the ON state 200A and OFF state 200B of the metal oxide switch, as exemplarily fabricated between a first wiring line 210 and a second wiring line 220.

Assuming the metal oxide switch is initially in the non-conductive state, operation of the metal oxide switch occurs when a voltage is applied in a direction that causes a high current greater than, for example, 0.1 mA to flow from one electrode to the other. This action causes positive carriers, such as oxygen vacancies, to form a path between the two electrodes. When the current flow is discontinued, the positive carriers remain along this path in the metal oxide material, thereby maintaining a conductive state shown in 200A. The ON state 200A can be reversed by providing voltage in the opposite direction, so that a reverse current flow causes the positive carriers to return to a random state without a conduction path, which is the non-conductive state 200B.

The amount of conductivity in the ON state can be modified by controlling the amount of current used to transition to the ON state, with higher current level providing greater conductivity for the ON condition. This aspect will be further explained in the discussion for FIG. 3. A typical ON resistance value, using HfO as the metal oxide, is 1 kΩ or lower. In some embodiments, the ON resistance value is of the order 100Ω or less.

As is shown in FIG. 2B, the metal oxide switch can be fabricated between a first patterned conductor 210 and a second patterned conductor 220, both of which may each be patterned conductors comprised of a metal, for example, copper (Cu). These patterned conductors 210 and 220 can be formed by a Cu damascene process, for example. In other embodiments, the patterned conductors 210 and 220 may comprise tungsten, aluminum, tantalum, molybdenum, a metal silicide, etc. The first and second electrodes 204 and 206 may perform the function of preventing the mixing or reaction of the metal oxide 205 with the patterned conductors.

Thus, the first and second patterned conductor 210,220 can serve to activate/deactivate the metal oxide switch by appropriately applying voltage/current to the two lines 210,220, and the present inventors have recognized that this switching capability can be used in a number of circuits for various functions. For example, chip operating life can be extended when a memory array contains failed bits and the metal oxide switch is used to select a second memory array without failed bits.

Additionally, because the ON/OFF states of the metal oxide switch can be changed, these metal oxide switches also provide the feature of reprogrammability. Accordingly, the present invention teaches the concept that these metal oxide switches can be used in any circuit that would benefit to extend chip operating life, reduce chip area, or reduce the number of required interconnect lines particularly when the capability of reprogrammability is also desired. Examples of such circuits would include FPGA circuits, redundancy circuits in certain types of memory devices, and circuits that are custom programmed based upon function testing upon conclusion of fabrication. Also, the present invention teaches an example of using these metal oxide switches within a signal routing hub that connects blocks of a microprocessor or other circuit.

However, these several examples are intended as merely exemplary and should not be considered as exhaustive, since the present invention can be considered as teaching a new method of providing reprogrammable switching functions in any number of circuit applications.

In a first exemplary circuit used to explain the concepts of the present invention, as involving FPGAs, the metal oxide switch 200 may be fabricated in a via formed between the first and second patterned conductors 210 and 220.

As mentioned above, it is possible to reversibly form and destroy a conduction path in the metal oxide 205. For example, FIG. 2B shows the metal oxide switch 200 in both a conductive state 200A (low resistance or on) and a non-conductive state 200B (high resistance or off). Unlike some conventional technologies which can only be programmed once, when the metal oxide switch is used it is able to be programmed and reprogrammed multiple times by selectively changing the ON/OFF state of the metal oxide region.

Redundant Memory Arrays

The metal oxide switch of the present invention is also well suited to address issues of chip yield. Chip yield is the ratio of acceptable tested chips to the total number of chips tested and is a strong function of the number of fully functional memory arrays on a chip. It is well known that providing redundant memory arrays on a same chip can increase yield.

Previously, an eFuse may be provided between various redundant memory arrays and when a defective array (or collection thereof) is identified, the fuse can be used (e.g., blown) in order to remove the defective array from the active signal path. In embodiments of this disclosure, the metal oxide switch performs the function of the fuse or antifuse, and the switch can advantageously even be used more than once.

The metal oxide switch 200 of the present invention is able to be reprogrammed more than once, therefore, according to the present invention, it is possible to switch between redundant memory arrays, as needed. As a result, this invention provides a mechanism for redundancy in a the memory arrays of any type of circuit. A redundant (good) memory array can selectively be substituted for a memory array found to be defective, either at chip test or after operation in the field. It is also possible to increase the lifetime of a chip, by allowing the metal oxide switch 200 to select between the various redundant arrays subsequent to initial fabrication, since the metal oxide switches of the present invention are reprogrammable. Additionally, other redundant circuit blocks may be selected in order to extend chip life within the invention.

In other words, the metal oxide switch 200 is able to replace the conventional fuse in various circuit configurations. The use of one time programmable fuses, such as, for example, an eFuse, to select a memory array, for example, from a set of redundant memory arrays is well known in the art. However, the present invention provides at least the following three advantages over fuses that are programmable one time. First, the metal oxide switch 200 of the present invention is may be programmed multiple times (re-set), and, second, a lower write current may be used when compared with conventional fuses, such as, for example, the eFuse. Third, a small saving in chip area is typically achieved by the metal oxide switch because it does not require area on the Si wafer substrate.

As mentioned above, the metal oxide switch 200 is programmed using current. For example, as a level of current being applied to the first wiring element 210 becomes greater the level of resistance of the reprogrammable antifuse 200 becomes less.

Figure 2C:
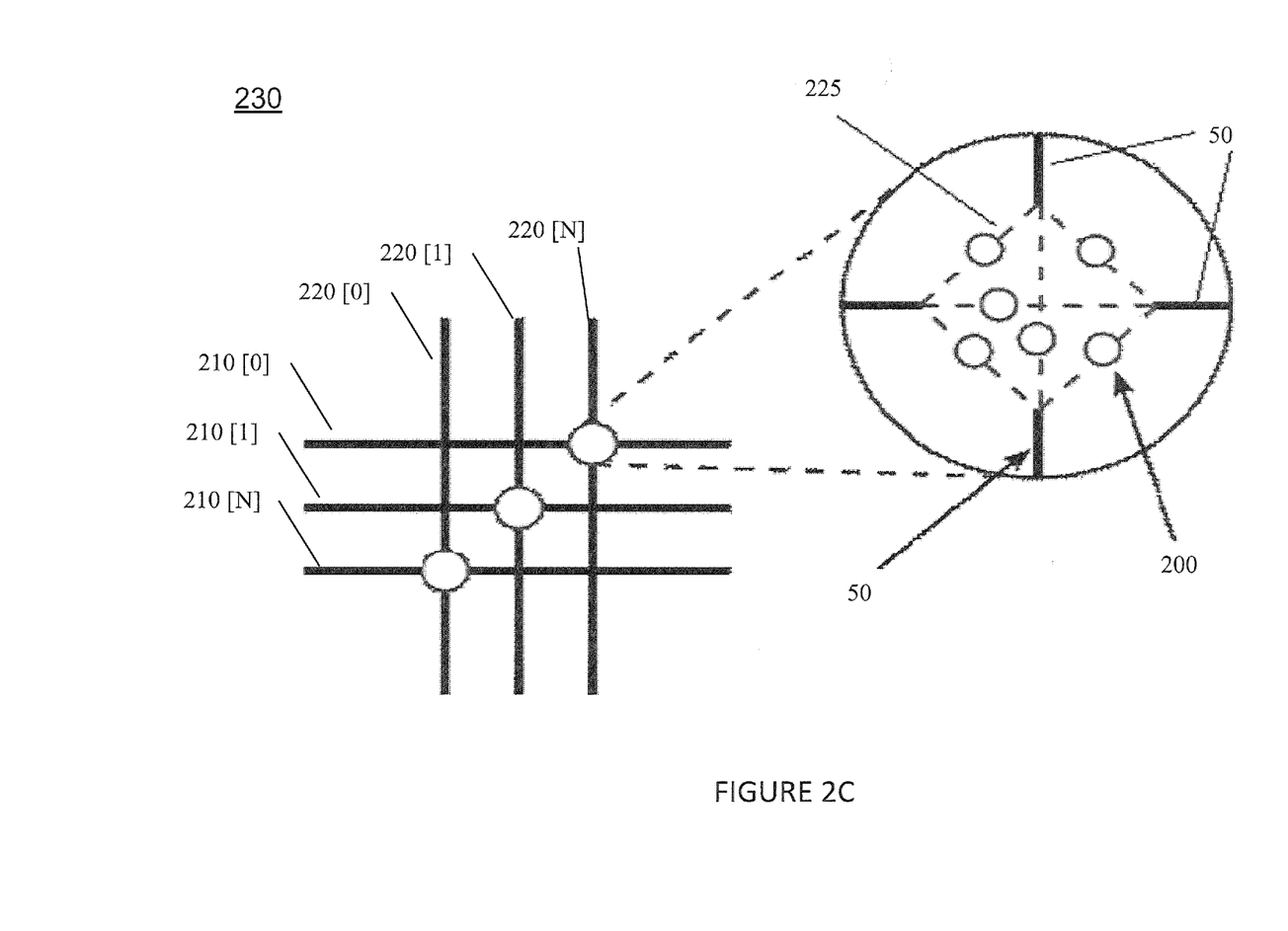
FIG. 2C shows an exemplary wiring structure 230 that can be used in an exemplary embodiment of the present invention.

FIG. 2C shows an exemplary wiring structure in which the metal oxide switches of the present invention can be used. This type of structure is conventionally known to be used in the front end of line (FEOL) processing for basic crystal and silicon devices. In contrast, the present invention has the advantage of providing this structure as a metal oxide switch 200, which can fabricated in the back end of line (BEOL) wiring layers, thus reducing the area of the chip.

It is noted that FEOL is understood by one having ordinary skill in the art as referring to the first portion of IC fabrication when individual devices such as transistors, capacitors, resistors, etc., are patterned in the Si wafer. FEOL is typically understood as covering fabrication up to, but not including, the deposition of metal interconnect layers.

BEOL is understood as referring to the second portion of IC fabrication, in which individual devices on the wafer are interconnected with wiring. BEOL includes contacts, insulation layers (dielectrics) between wiring layers, metal levels, and bonding sites for chip-to-package connections. Since copper and aluminum are often used for the metal layers, the BEOL processing involves lower temperatures from FEOL processing.

For example, in an exemplary embodiment involving an array 225 of metal oxide switches 200 shown in FIG. 2C, wiring segments 50 enter the array 225, so that the metal oxide switches provide a circuit function that allows for reconfigurable or reprogrammable wiring paths. For example, and not by way of limitation, as is shown in FIG. 2C, six metal oxide switches 200 are depicted in the array 225. By selectively setting any of the six metal oxide switches 200 to a conductive state 200A or a non-conductive state 200B, the connection of the wiring segments 50 can be set to create a specific conductive path.

This exemplary embodiment allows the present invention to provide an FPGA circuit having a metal oxide switch 200 provided in a via between patterned conductor 210 [0]-210 [N] and a patterned conductor 220 [0]-220[N]. Thereby and returning to the conventional FPGA shown in FIG. 1, the present invention can be implemented within an FPGA or similar IC in which the connection paths between logic elements (not depicted) in the LBs 30 use the metal oxide switches 200 to set connections.

The structure of the metal oxide switch 200 is quite small and simple relative to the large and more complex structure of an SRAM cell 70 that is used in conventional FPGA technologies, and comprises six transistors as described above in Background. Also, the metal oxide switch 200 is able to easily store a bit of data, and to retain this information when the circuit is turned off (powered down), thereby providing another advantage over conventional FPGA circuits.

Figure 2D:
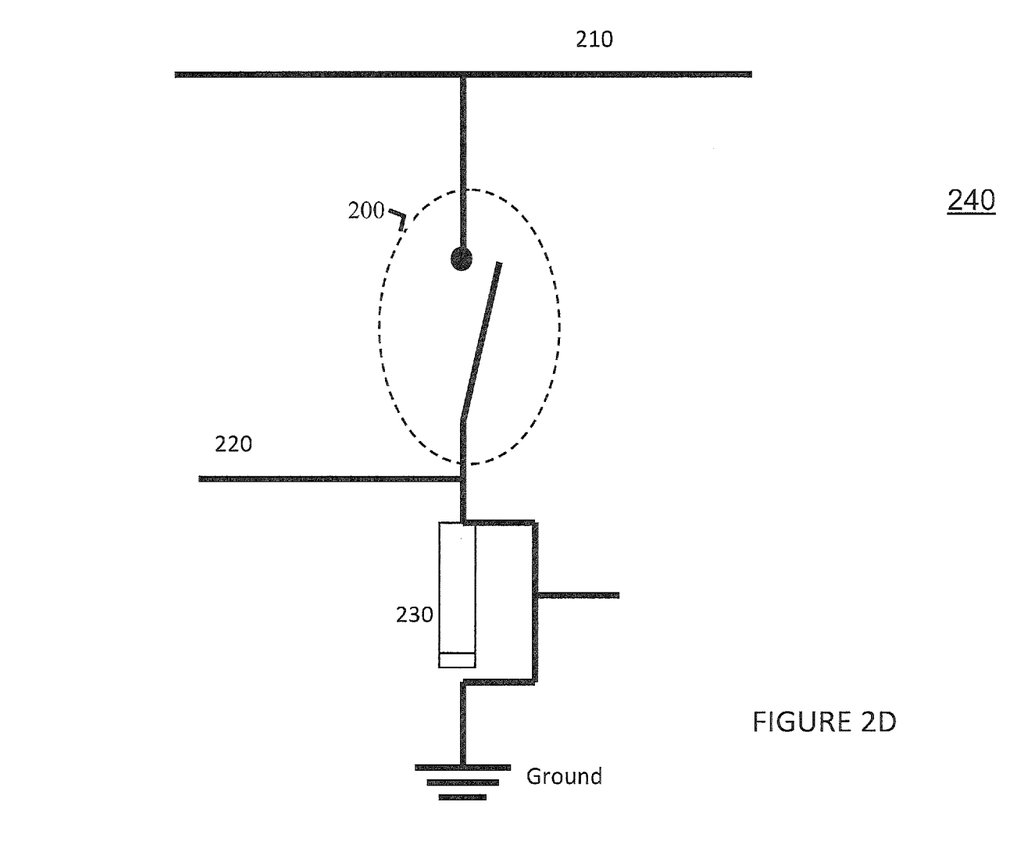
FIG. 2D shows an exemplary embodiment 240 where a metal oxide switch 200 is used in combination with a transistor 230.

In yet another exemplary embodiment, FIG. 2D shows the metal oxide switch 200 connected to a transistor 230, which connects between the second wiring line 220 and a low voltage interconnection (e.g., a ground interconnection). In some exemplary embodiments, the transistor 230 is a field effect transistor (FET). The FET is preferably an N-type FET having a source connected to a low voltage or ground interconnection and a drain connected to the second wiring line 220. Accordingly, an increase in the gate voltage (Vg) will increase the drain current (ID) until the transistor 230 enters the saturation mode.

Figure 3:
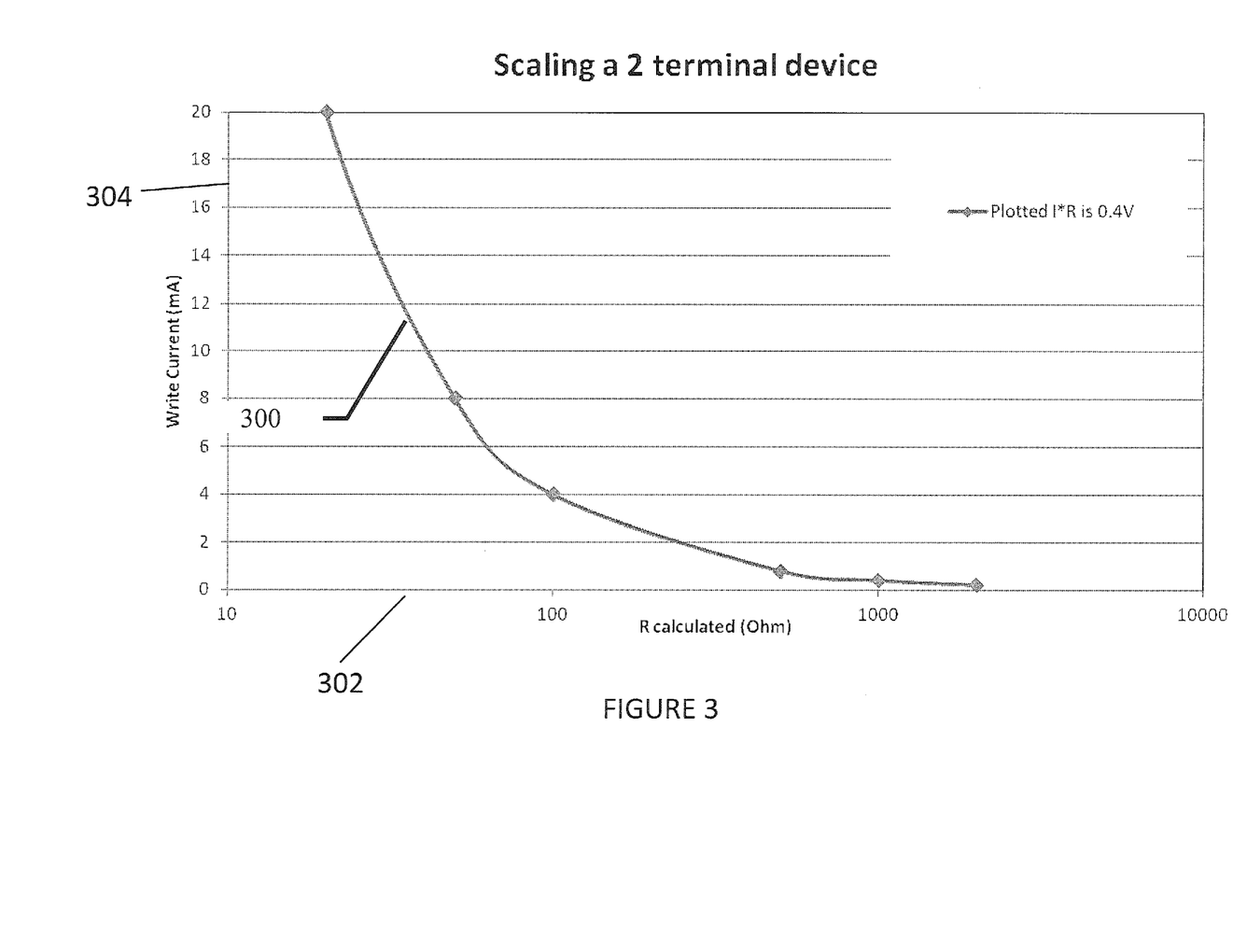
FIG. 3 is a plot 300 of programming (or write) current used to "write" the low resistance state of the metal oxide switch versus the resultant resistance of the metal oxide switch.

FIG. 3 shows an operating curve 300 of a metal oxide switch of the present invention and shows that, as the programming current applied to the switch 200 increases, the resistance of the decreases. That is, FIG. 3 is a plot of programming (or write) current on the y-axis 304 used to set the low resistance state 200A (e.g., turn the metal oxide switch to its ON state) versus the resultant resistance of the switch on the x-axis 302. As can be seen in FIG. 3, the metal oxide switch 200 follows the equation I*R=0.4V, where I is the programming (or write) current, R is the resistance of the metal oxide switch, and V is the programming voltage.

It is noted that this specific example (I*R=0.4 V) is intended as merely exemplary, and other relations may describe the current I and resulting resistance R. Based on the above description of the principle of operation of the metal oxide switch, it should be apparent to one having ordinary skill in the art, that the switch could be operated in either direction on this curve, thereby either turning the switch ON or OFF.

Based on this exemplary characteristic curve 300 of FIG. 3, it should also be clear that a key aspect of the present invention is that it teaches that the metal oxide switch 200 can be implemented into any number of conventional circuits that have a switching function and that would benefit by a switch mechanism that retains the state when the circuit is turned off (powered down) and that does not require Si substrate area.

As can be seen from this characteristic curve 300, a typical substitution of the metal oxide switch 200 for a conventional switch mechanism would require a dual-direction current flow, meaning that voltage polarities would be switched for changes of state for the metal oxide switch. However, it is not critical how such change in current flow is implemented, meaning that it does not matter whether the two switch terminals are selectively and reversibly connected to two voltage sources, or whether one switch terminal is grounded and the other switch terminal is selectively connected to one of a +/−voltage source.

It should also be noted that implementation of the metal oxide switch 200 of the present invention into a conventional circuit would not require that current through the switch be controlled or monitored, Rather, what the characteristic curve 300 shows is that it would be simple to change switch states from a first approximate resistance value through the metal oxide layer to a second approximate resistance value by merely applying a known voltage to the two terminals, and recognizing that the characteristic curve teaches that the switch will accordingly change resistance value sufficiently to define two switch states.

In a typical implementation, when the reprogrammable metal oxide switch 200 is programmed to be in the low resistance state 200A, it is preferable that the resistance is 1 kΩ or less. As shown in FIG. 3, in order to achieve this low resistance state 200A, a large driving current must be applied to the reprogrammable antifuse 200 (e.g., a current of 0.4 mA or more).

On the other hand, when the reprogrammable metal oxide switch 200 is programmed to be in the non-conductive state 200B, it is typically preferable the resistance of the switch 200 is 100 MΩ to 1 GΩ, although lower resistance values are also useful in some circuit applications.

In another aspect of the present invention, one feature of the metal oxide switch 200 can be adjusted as a design parameter. The OFF resistance can be increased by making the area of both electrodes smaller (decreasing the area). It is typical of the metal oxide switch that electrode area does not affect the ON resistance.

Figure 4:
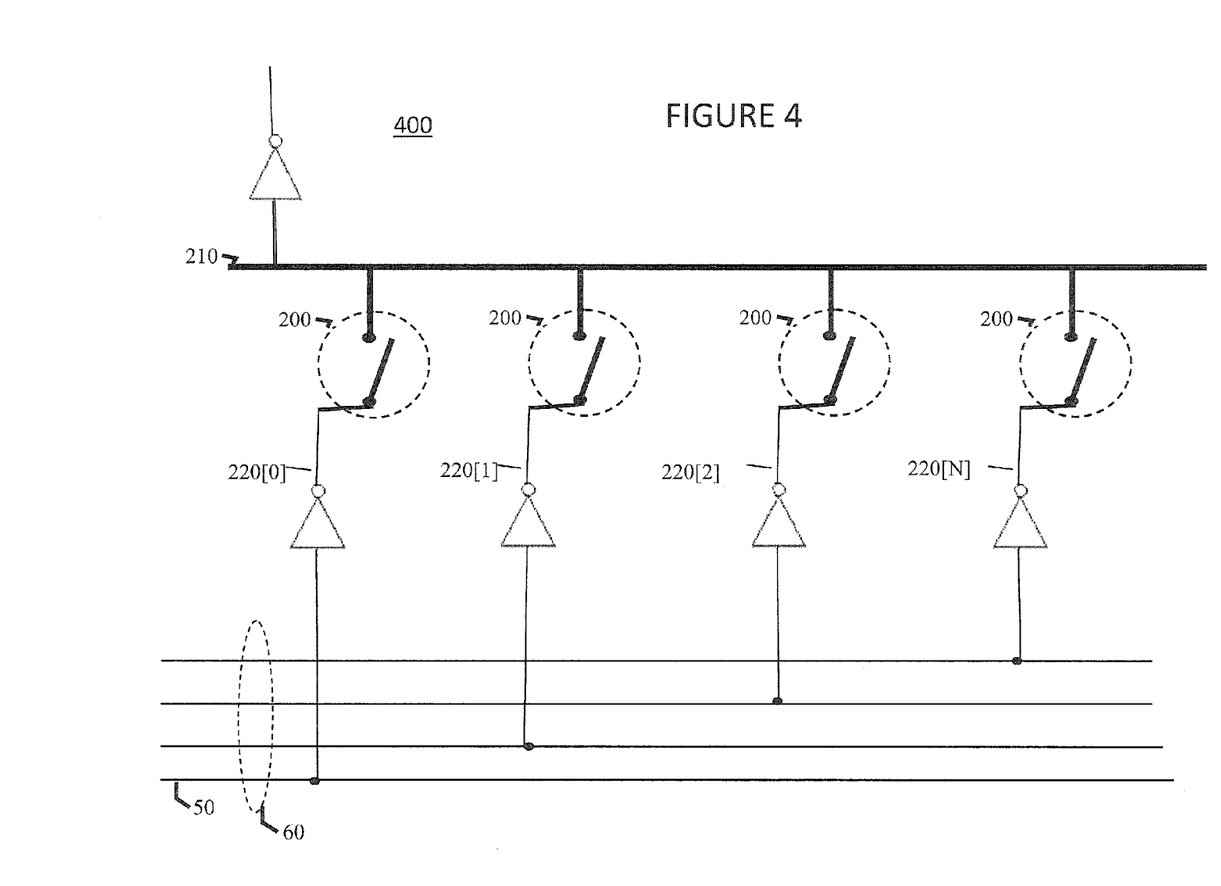
FIG. 4 shows an array 400 of metal oxide switches 200.

FIG. 4 shows another exemplary embodiment 400 of the present invention, in which an array of reprogrammable metal oxide switches 200 are connected between a patterned conductor 210 and additional patterned conductor 220 [0]-220 [N], where N is any integer equal to or greater than 1.

For example, the array 400 of reprogrammable metal oxide switches 200 might be included in an FPGA circuit, within a connection block of the FPGA integrated circuit (IC). Specifically, unlike the CB 20 of the related art, the SRAM cells 70 and the large pass gate transistor 80 discussed relative to FIG. 1, for conventional FPGA implementations, are not included in a connection block (CB) 400 of an FPGA circuit using the concepts of the present invention, which utilizes instead reprogrammable metal oxide switches 200.

Each of the patterned conductors 220 [0]-220 [N] is respectively connected to a terminal of a reprogrammable metal oxide switch 200 at one end and is respectively connected to a different segment 50 of the set of patterned conductors 60 at the other end. The patterned conductor 210 is connected to the other terminal of each of the metal oxide switches 200. Depending on the number of wire segments 50 per set 60, more or less metal oxide switches 220 may be provided.

Figure 5:
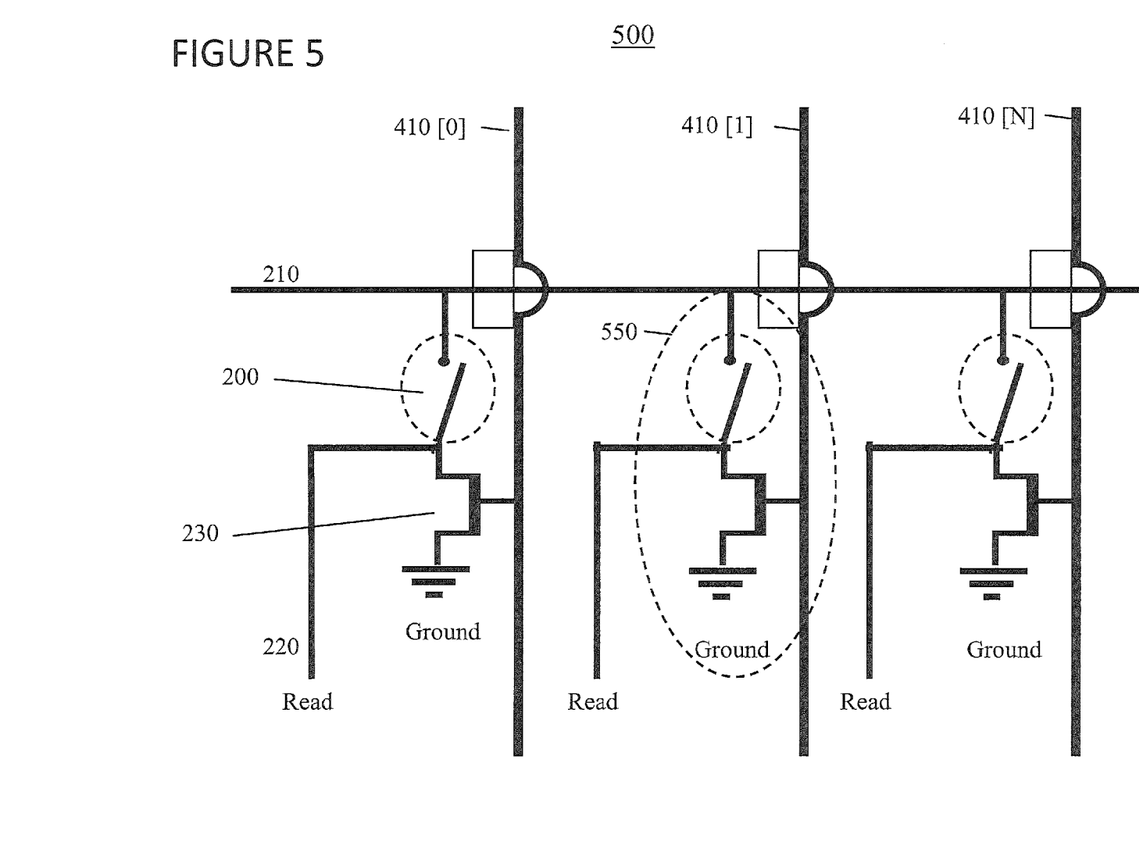
FIG. 5 shows another exemplary embodiment 500 of the present invention in which a transistor is provided to select one specific metal oxide switch within an array of these switches and to program the resistance of this device.

FIG. 5 shows yet another exemplary embodiment 500 of the present invention, in which a transistor 230 is provided in series with each metal oxide switch. Shown in FIG. 5, when the transistor 230 is conducting (on) a current flows from patterned conductor 210 to ground. For example, this current is described in FIG. 3. The gate of each of the transistors 230 is respectively connected to a different patterned conductor 410 [0], 410 [1], and 410[N], where N is any integer equal to or greater than 1. Here the number of associated circuits 450 is arbitrarily shown as three, however, more or less can be provided.

Figure 6:
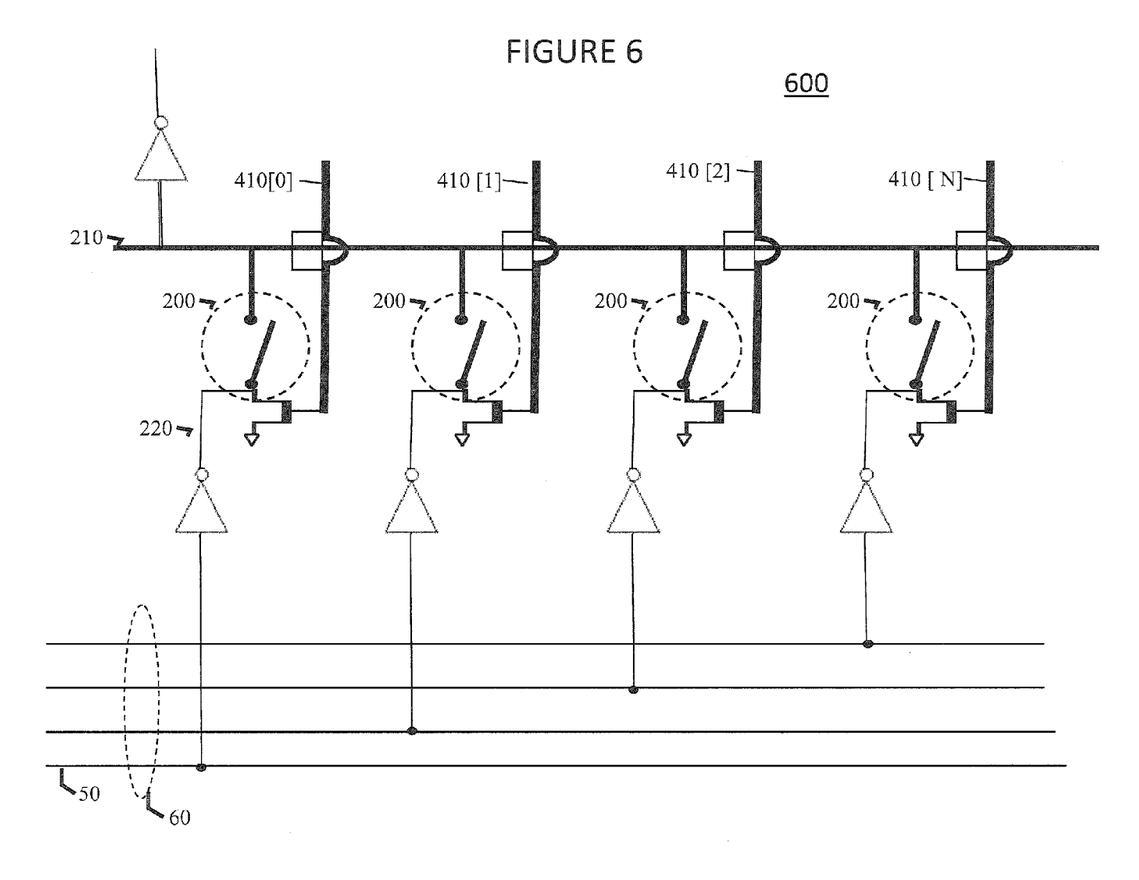
FIG. 6 shows an exemplary embodiment 600 of the present invention in which the exemplary embodiment 500 shown in FIG. 5 is provided within a connection block of a Field Programmable Gate Array integrated circuit.

FIG. 6 shows an example of the exemplary embodiment shown in FIG. 5 being provided within a connection block 600 of an FPGA integrated circuit.

Figure 7:
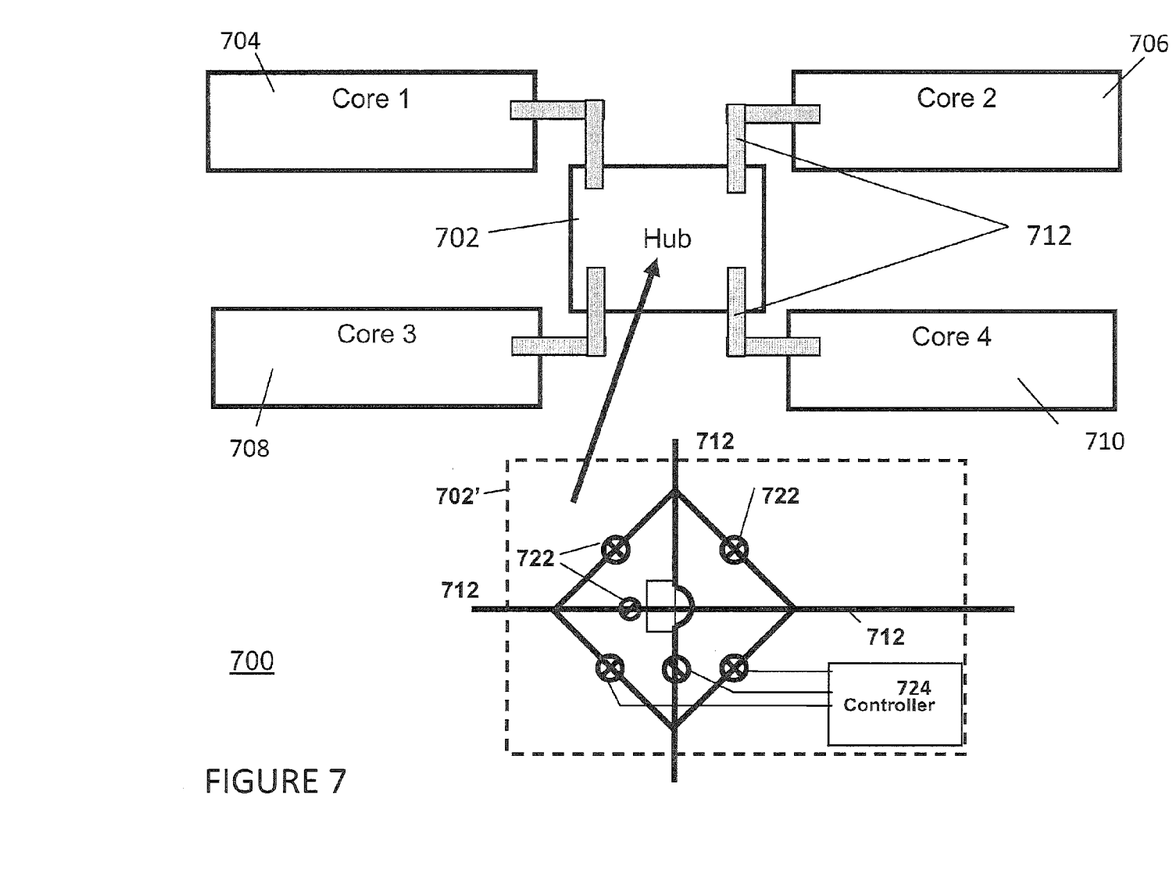
FIG. 7 shows an exemplary embodiment 700 of the present invention in which circuit blocks, for example cores, are interconnected through a central routing hub where connections may be open and closed using the metal oxide switch of this invention.

FIG. 7 shows yet another exemplary embodiment of the present invention, in which an advanced microprocessor or other circuit is shown. As is known in the art, an advanced microprocessor may be designed with independent computational processing units known as cores, and for example the number of cores integrated on a microprocessor chip may be any small integer, with 2, 4, 8, 16 and larger powers of 2 being common examples. Commonly, the cores are identical processing units, but this is not required. According to conventional prior technology, to accomplish data sharing between cores an interconnect path must be patterned and fabricated between each and every core. The number of these fabricated connections being N^2, where N is the number of cores.

Within the embodiment shown in FIG. 7, 4 computational processing units (cores) are used while it is understood that any number of cores may be connected according to the basic scheme. Referring to FIG. 7, 4 cores are labeled from 704 to 710. The signal routing hub section of the advanced microprocessor is 702. This hub 702 is able to make and open in a reprogrammable fashion the signal path between each and every core. It is noted that each core is connected by a major patterned conductor path 712 to the hub 702. In other embodiments, there may be more or fewer cores and more or fewer major patterned conductor paths, with 4 being a convenient example. One example internal layout of hub 702 is shown as the box 702'. It will be understood that other internal layouts may accomplish the inventive reprogrammable routing function described here. Each major patterned conductor 712 has 6 metal oxide switches 722 connected to it, and each of these may be set as either open or closed. A control circuit function is shown as the box 724 called controller, and it will be understood that a signal path connects each metal oxide switch 722 to said controller, while the figure shows only some of these signal paths. The control circuit 724 can set each switch as either open or closed. Each metal oxide switch has 1 electrode connected to 1 segment of a major patterned conductor.

Within a conventional prior technology, the hub 702 may be fabricated with switches in the Si wafer substrate, but this requires Si chip area and longer signal paths. One advantage of the embodiment shown in FIG. 7 are a saving in the chip area. The inventive hub may be fabricated within the interconnect levels of the integrated circuit. It will be understood that other circuit blocks (not cores) may be connected to share data or other information using the signal routing hub of this invention.

While the invention has been described in terms of several exemplary embodiments, those skilled in the art will recognize that the invention can be practiced with modification within the spirit and scope of the appended claims.

Further, it is noted that, Applicants' intent is to encompass equivalents of all claim elements, even if amended later during prosecution.

What is claimed is:

1. An electronic circuit, comprising:
   a plurality of electronic devices configured as interconnected to provide one or more circuit functions; and
   at least one interconnect structure comprising:
      a first patterned conductor connected to a terminal of a first electronic device in said electronic circuit;
      a second patterned conductor connected to a terminal of a second electronic device in said electronic circuit;
      a first electrode connected to a portion of the first patterned conductor;
      a second electrode connected to a portion of the second patterned conductor; and
      a metal oxide region formed between said first electrode and said second electrode,
   wherein said metal oxide region provides a reprogrammable switch function between said first patterned conductor and said second patterned conductor by providing a conductivity that is selectively controlled by a direction and an amount of current that passes through said metal oxide region during a switch setting operation for said metal oxide region,
   wherein said first and second electrodes maintain a separation between said metal oxide and said patterned conductors, and
   wherein said metal oxide region provides a function as a reprogrammable selection device to circumvent a fabrication failure or defect of a chip containing said electronic circuit.

2. The electronic circuit of claim 1, wherein said switch setting operation causes carriers in said metal oxide layer to be arranged in a position in said metal oxide region that sets the conductivity between said first and second patterned conductors.

3. The electronic circuit of claim 2, wherein said carriers comprise oxygen vacancies in said metal oxide region.

4. The electronic circuit of claim 1, comprising a field programmable gate array (FPGA) circuit.

5. The electronic circuit of claim 1, said metal oxide region providing a selection function in a circuit for selecting from a plurality of redundant memory arrays.

6. The electronic circuit of claim 1, comprising a signal routing hub located within a microprocessor or application specific integrated circuit.

7. The electronic circuit of claim 6, wherein the signal routing hub is configured to form and to open conductive signal paths between circuit blocks of the microprocessor or the application specific integrated circuit using a plurality of metal oxide switches to perform the function of forming and opening said paths.

8. The electronic circuit of claim 7, wherein said circuit blocks comprise computation processing units or cores.

9. The electronic circuit of claim 7, wherein said circuit blocks and said signal routing hub are connected by a fixed interconnection signal path.

10. The electronic circuit of claim 1, said metal oxide region thereby providing selectively reprogrammable conductivity states between said first patterned conductor and said second patterned conductor.

11. The electronic circuit of claim 10, wherein a different value of conductivity of an ON state can be achieved.

12. The electronic circuit of claim 10, wherein said selectively reprogrammable conductivity is independent of the chip being powered on or off.

13. The electronic circuit of claim 1, wherein said metal oxide region is formed in back end of line (BEOL) wiring layers of a chip containing said electronic circuit.

14. The electronic circuit of claim 1, wherein said metal oxide region is formed as a via structure that interconnects said first patterned conductor and said second patterned conductor.

15. The electronic circuit of claim 1, wherein said metal oxide region comprises at least one of: Hafnium Oxide (HfOx); Tantalum Oxide (TaOx); Nickel Oxide (NiOx); Titanium Oxide (TiOx); Tungsten Oxide (WOx); Aluminum Oxide (AlOx); Strontium Titanium Oxide (SrTiOx); Zirconium oxide (ZrOx); and Zinc Oxide (ZnOx); or any combination of these metal oxides.

16. The electronic circuit of claim 1, wherein said first and second electrodes comprise at least one of hafnium (Hf); Vandium (V); iridium (Ir); platinum (Pt); tungsten (W); iridium oxide (IrOx); titanium nitride (TiN); titanium aluminum nitride (TiAlN); ruthenium (Ru); and ruthenium oxide (RuOx).

17. The electronic circuit of claim 1, wherein at least one of said first and second electrodes comprises a nitride that is non-stoichiometric, such as $W_x N_y$, $Ta_x N_y$, $Ti_x N_y$, where $y>1$ and $x<1$, or where $y<1$ and $x>1$.

18. The electronic circuit of claim 15, further comprising at least one layer of $SiO_x$ or $SiN_x$ or SiCN between one of said first and second electrodes and said metal oxide region.

19. An electronic chip comprising the electronic circuit of claim 1.

20. A method of fabricating an electronic chip, said method comprising:
    forming a plurality of electronic devices configured as interconnected to provide one or more circuit functions; and
    forming at least one interconnect structure comprising:
        a first patterned conductor connected to a terminal of a first electronic device in said electronic circuit;
        a second patterned conductor connected to a terminal of a second electronic device in said electronic circuit;
        a first electrode connected to a portion of the first patterned conductor;
        a second electrode connected to a portion of the second patterned conductor; and
        a metal oxide region formed between said first electrode and said second electrode,
    wherein said metal oxide region provides a reprogrammable switch function between said first patterned conductor and said second patterned conductor by providing a conductivity that is selectively controlled by a direction and an amount of current that passes through said metal oxide region during a switch setting operation for said metal oxide region,
    wherein said first and second electrodes maintain a separation between said metal oxide and said patterned conductors, and
    wherein said metal oxide region provides a function as a reprogrammable selection device to circumvent a fabrication failure or defect of a chip containing said electronic circuit.

21. A method of providing a switching function in an electronic circuit comprising a plurality of electronic devices configured as interconnected to provide one or more circuit functions, said method comprising:
    forming at least one interconnect structure comprising:
        a first patterned conductor connected to a terminal of a first electronic device in said electronic circuit;
        a second patterned conductor connected to a terminal of a second electronic device in said electronic circuit;
        a first electrode connected to a portion of the first patterned conductor;
        a second electrode connected to a portion of the second patterned conductor; and
        a metal oxide region formed between said first electrode and said second electrode,
    wherein said metal oxide region provides a reprogrammable switch function between said first patterned conductor and said second patterned conductor by providing a conductivity that is selectively controlled by a direction and an amount of current that passes through said metal oxide region during a switch setting operation for said metal oxide region,
    wherein said first and second electrodes maintain a separation between said metal oxide and said patterned conductors, and
    wherein said metal oxide region provides a function as a reprogrammable selection device to circumvent a fabrication failure or defect of a chip containing said electronic circuit.

22. The electronic circuit of claim 1, comprising circuit blocks of a microprocessor or an application specific integrated circuit,
    wherein the circuit blocks comprise computation processing units or cores.

* * * * *